United States Patent
Kim et al.

(10) Patent No.: US 6,919,827 B2
(45) Date of Patent: Jul. 19, 2005

(54) METHOD AND APPARATUS FOR EFFECTIVELY DECODING HUFFMAN CODE

(75) Inventors: Su-hyun Kim, Seoul (KR); Soon-back Cha, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/968,995

(22) Filed: Oct. 21, 2004

(65) Prior Publication Data

US 2005/0122240 A1 Jun. 9, 2005

(30) Foreign Application Priority Data

Dec. 3, 2003 (KR) .............................. 10-2003-0087260

(51) Int. Cl.[7] .............................................. H03M 7/40
(52) U.S. Cl. .......................................... 341/65; 341/67
(58) Field of Search ........................... 341/65, 67, 106, 341/107, 79, 95, 50, 51, 64; 375/240.01, 240.23, 240.25

(56) References Cited

U.S. PATENT DOCUMENTS

| | | | |
|---|---|---|---|
| 5,615,020 A | | 3/1997 | Keith |
| 5,617,089 A | * | 4/1997 | Kinouchi et al. ............. 341/65 |
| 5,686,915 A | * | 11/1997 | Nelson et al. ................ 341/65 |
| 6,404,358 B1 | * | 6/2002 | Sanguinetti .................. 341/65 |
| 6,563,440 B1 | * | 5/2003 | Kangas ........................ 341/65 |
| 6,580,377 B1 | * | 6/2003 | Du et al. ...................... 341/67 |
| 6,621,429 B2 | * | 9/2003 | Tsuchido et al. ............. 341/65 |

FOREIGN PATENT DOCUMENTS

| | | |
|---|---|---|
| JP | 9-246991 A | 9/1997 |
| KR | 2001-0058369 A | 7/2001 |
| WO | WO 98/29955 A1 | 7/1998 |
| WO | WO 02/37690 A2 | 5/2002 |

* cited by examiner

*Primary Examiner*—Brian Young
(74) *Attorney, Agent, or Firm*—Sughrue Mion, PLLC

(57) ABSTRACT

A method for constructing and searching an improved Huffman table which is capable of improving the efficiency over an existing Huffman table in a decoding method and apparatus using a Huffman code. The method includes creating an improved Huffman table including an increment of a Huffman code length and the number of times Huffman code lengths repeats; generating a new bit string by extracting bits by the increment of the Huffman code length and adding the extracted bits to the end of a previous bit string; and reading values of corresponding codes by the number of times Huffman code length repeats from the improved Huffman table and determining whether values identical to a value of the new bit string are present. According to the present invention, unnecessary consumption of system resources can be reduced by decreasing the number of times search and comparison routines of Huffman codes are used.

9 Claims, 7 Drawing Sheets

```
int Huf_Table_12[] = {
    1,  2,  3,  5,  5,  6,  7,  7,  7,  7,  7,  7,   //CodeLength
    1,  0,  2, 15, 12, 29, 57, 56, 55, 54, 53, 52,   //CodeWord
    1,  2,  3,  4,  5,  6,  7,  8,  9, 10, 11, 12,   //QuantValue
};
```

FIG. 3

| Huffman code | QuantValue |
|---|---|
| 1 | 1 |
| 00 | 2 |
| 010 | 3 |
| 01111 | 4 |
| 01100 | 5 |
| 011101 | 6 |
| 0111001 | 7 |
| 0111000 | 8 |
| 0110111 | 9 |
| 0110110 | 10 |
| 0110101 | 11 |
| 0110100 | 12 |

```
int Huf_Table_12[ ] = {
        1,  2,  3,  5,  5,  6,  7,  7,  7,  7,  7,  7,    // CodeLength
        1,  0,  2, 15, 12, 29, 57, 56, 55, 54, 53, 52,    // CodeWord
        1,  2,  3,  4,  5,  6,  7,  8,  9, 10, 11, 12,    //QuantValue
};
```

Sets of additional Information ⇒ (1, 1), (1, 1), (1, 1), (2, 2), (1, 1), (1, 6)   // (CodeLength_Inc , RepeatNum)

FIG. 6

```
int CodeInfo_Table_12[ ] = {
        1,  1,  1,  1,  1,  1,  2,  2,  1,  1,  1,  6,    //  Additional Information table
};                                                             (CodeLength_Inc & RepeatNum)

int Huf_Table_12[ ] = {
        1,  0,  2, 15, 12, 29, 57, 56, 55, 54, 53, 52,    // CodeWord
        1,  2,  3,  4,  5,  6,  7,  8,  9, 10, 11, 12,    //QuantValue
};
```

METHOD AND APPARATUS FOR EFFECTIVELY DECODING HUFFMAN CODE

This application claims priority of Korean Patent Application No. 10-2003-0087260 filed on Dec. 3, 2003 in the Korean Intellectual Property Office, the disclosure of which is incorporated herein in its entirety by reference.

BACKGROUND OF THE INVENTION

1. Field of the Invention

The present invention relates to a method for compressing data, and more particularly, to a method for constructing and searching an improved Huffman table which provides improved efficiency over an existing Huffman table in a method and apparatus for decoding data using a Huffman code used widely in processing data such as audio, video and the like.

2. Description of the Related Art

Recently, with the rapid development of computers, a system for compressing data by treating a mass of data and efficiently using a memory unit has been popular to thereby reduce data transfer time.

There have been known a variety of encoding methods used when data are compressed. Among the methods, an encoding method applicable to a variety of data without limiting the target data to be encoded to character cords, vector information, images, etc., is called universal encoding. Universal encoding is classified into directory type encoding using similarity of character strings and statistical probability type encoding using the frequency of occurrence of a character.

Figure 1:
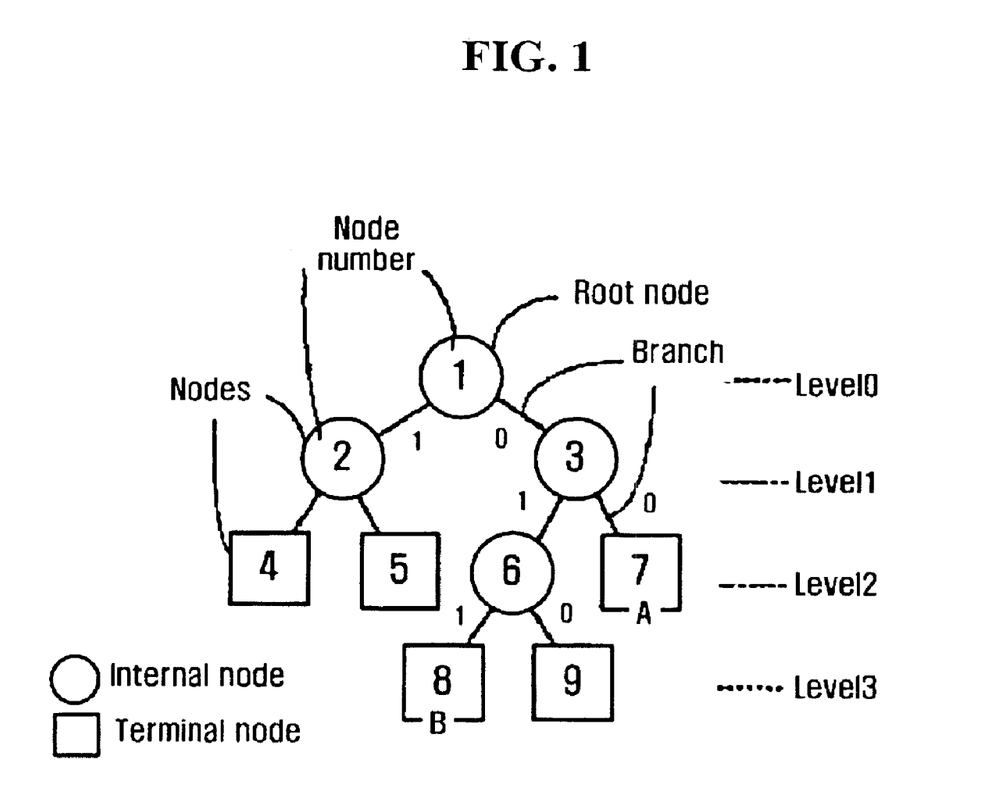
FIG. 1 is a view illustrating an example of a Huffman tree.

A representative statistical probability type coding is a Huffman encoding. The Huffman encoding uses codes having a length inversely proportional to the frequency of occurrence of a character (Huffman code). First, a Huffman tree, which is a data structure used in the generation of the Huffman code, will be described with reference to FIG. 1. In FIG. 1, portions indicated by circles and squares are referred to as nodes. A node existing in the highest level is referred to as a 'root node' and a segment of a line connecting the nodes is referred to as a 'branch'. Further, a low level node Y connected to an existing node X by the branch is referred to as a 'child node' of node X whereas the node X is referred to as a 'parent node' of node Y. A node with no child node is referred to as a 'terminal node' corresponding to a character. Moreover, each of the nodes other than a terminal node is referred to as an 'internal node' and a 'level' is indicated by the number of branches from the root node to each of the nodes other than the root node.

In a Huffman tree, a path from the root node to a terminal node corresponding to a character to be encoded is output as a code. In other words, if a path is branched to the left from the root node to a target terminal node, "1" is output, or if it is branched to the right, "0" is output. For example, in the Huffman tree as shown in FIG. 1, a code "00" is output for a character A corresponding to a terminal node of node number 7 and a code "011" is output for a character B corresponding to a terminal node of node number 8.

In Huffman decoding, which is a reverse process of Huffman encoding, a character corresponding to a terminal node arriving from the root node according to a value of each bit of data to be decoded is output.

The Huffman encoding generates a Huffman tree in the following sequence (called a Huffman algorithm). First, the frequency of occurrence of a character corresponding to each terminal node is recorded. Second, for two nodes having the least frequency of occurrence, one new node is created and the created node and the two nodes are connected by branches, respectively. Further, the sum of occurrence frequencies of the two nodes connected to each other by a branch is recorded in the newly created node. Third, the second procedure is repeated until all nodes at all levels are combined into one tree.

In the Huffman tree generated in this sequence, a code having a length inversely proportional to the frequency of occurrence of each character is allocated for the character. For this reason, when characters are encoded using the Huffman tree, and the encoded characters are constructed as a table (referred to as a Huffman table) and then are decoded using the table in the Huffman decoding process, data can be compressed effectively.

This Huffman table may be known in advance in a Huffman encoder and a Huffman decoder, or may be transferred from the Huffman encoder to the Huffman decoder using header information when data are transferred. In the former method, several Huffman tables are specified after the frequency of occurrence of each character is statistically obtained, and the Huffman tables are stored in advance in the Huffman encoder and the Huffman decoder. Thereafter, when one of the specified Huffman tables is designated in transferring actual data, the data are decoded using the same table in the Huffman decoder. In the latter method, the frequency of occurrence of each character when data to be transferred are encoded in the Huffman encoder is obtained to create the Huffman table and then the data along with the created Huffman table are transferred to the Huffman decoder. Then, in the Huffman decoder, the data can be decoded using the transferred Huffman table.

Figure 2:
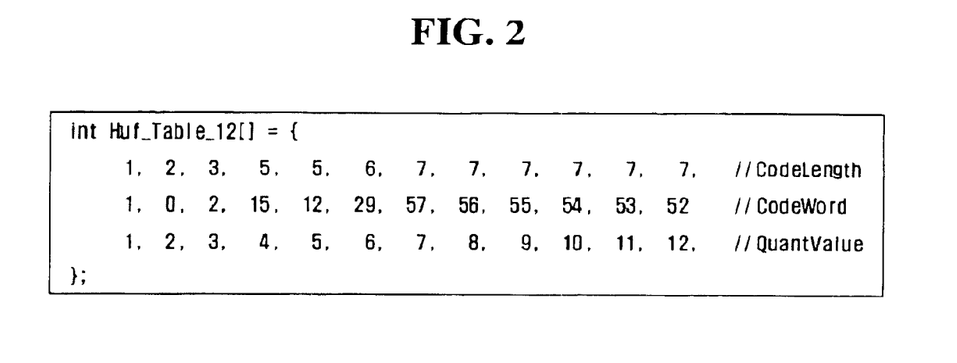
FIG. 2 is a view illustrating an example of a conventional Huffman table.
Figure 3:
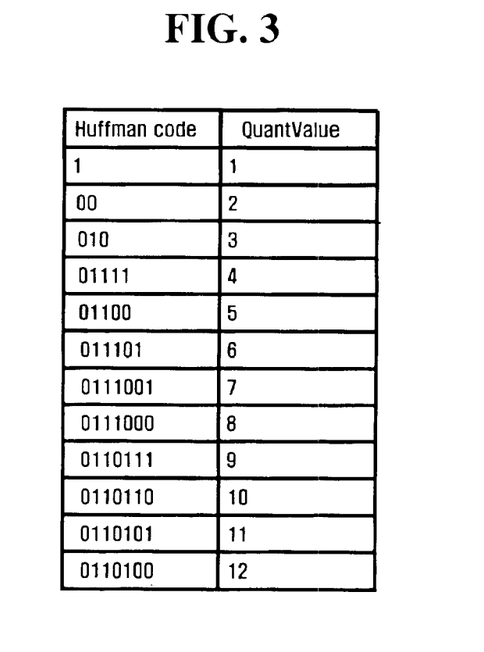
FIG. 3 is a table showing a conventional Huffman code applied to the example of FIG. 2.

FIG. 2 shows an example of a conventional Huffman table. The conventional Huffman table is composed of a 'CodeLength' representing a length of each Huffman code, a 'CodeWord' representing a decimal value of the Huffman code, and a 'QuantValue' representing a quantization value for identifying each Huffman code. Assuming that the Huffman code is created according to the frequency of occurrence of a character as shown in FIG. 1, a result can be obtained as shown in a table of FIG. 3. Here, each QuantValue indicating a value actually signified by data can represent a character such as {e, t, a, c, r, s, . . . } directly or a color such as {red, blue, yellow, . . . } depending on the kind of data (text data, image data and the like). When the table of FIG. 3 is organized as a Huffman table, the result sown in FIG. 2 can be obtained. One Huffman code can be divided into CodeLength and CodeWord. For example, '011101' can be represented by CodeLength of '6' and CodeWord of '29' in decimal number.

Figure 4:
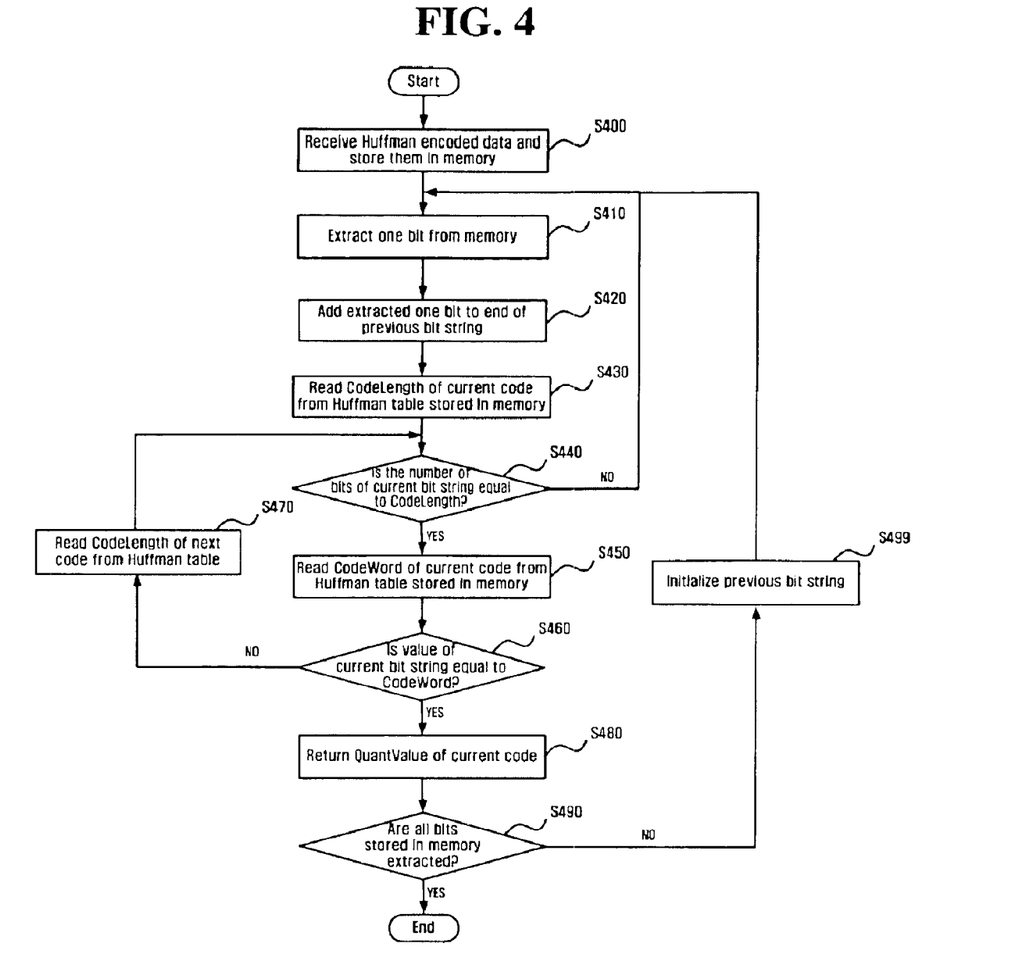
FIG. 4 is a flowchart illustrating a decoding method using the conventional Huffman table.

Now, a conventional Huffman decoding method using the above Huffman table will be described with reference to FIG. 4. First, Huffman encoded data are received and stored in a memory of a Huffman decoder (S400). Then, one bit is extracted from the memory (S410). The extracted bit is added to the end of the previous bit string (S420). Next, the CodeLength of the current code is read from the Huffman table stored in the memory (S430). The Huffman table may be stored in the memory after being received as part of the received data, or may be stored in advance in the memory of the Huffman decoder separately from the received data. Next, the number of bits of the current bit string is compared with the read CodeLength (S440). If they are not equal to each other, one bit is again extracted from the memory (S410). If they are equal to each other, the CodeWord corresponding to the CodeLength, i.e., the CodeWord of the current code, is read from the Huffman table (S450). Next, the current bit string is compared with a value of the CodeWord (S460). If they are not equal to each other, the CodeLength of the next code after the current code is read from the Huffman table stored in the memory (S470), and then the process returns to step S440 to compare the number of bits of current bit string with the read CodeWord.

As a result of comparison in step S460, if they are equal to each other, the QuantValue of the current code is returned (S480). Then, it is determined whether all bits of the data stored in the memory are extracted (S490). When all bits of the data are extracted, the process is ended. If any bit remains, previous bit strings are initialized to 'NULL' and then the steps before step S410 are performed.

Now, in order to more fully understand the process of FIG. 4, an example where actual values are applied to data will be described. For description, it is assumed that data received from the Huffman encoder and stored in the memory of the Huffman decoder is '000110111'. First, one bit (0) of the data is extracted. Since this bit is the first extracted bit, and therefore, there exists no previous bit string, the value of the bit is not changed even when step S420 is performed. CodeLength of '1' of a first code is read from the Huffman table stored in the memory (S430). Next, since the bit number '1" of the current bit string is identical to the CodeLength '1' (YES in step S440), a value '0' of the current string is compared with CodeWord '1' of the current code in the Huffman table (S460). Since the value '0' is not identical to the CodeWord '1', CodeWord '2' of the next code is read (S470) and then the bit number '1' of the current bit string is compared with CodeWord '2' (S440). Since the bit number '1' is not identical to CodeWord '2' as well, another bit '0' is again extracted from the memory (S410) and then is added to the end of the previous bit string '0' (S420). Then, the current bit string becomes '00'. CodeWord '2' of the current code is read from the Huffman table stored in the memory (S430). Next, since the bit number '2' of the current bit string is identical to CodeWord '2' (YES in step S440), a value of the current bit string ('0' in decimal number) is compared with CodeWord '0' of the current code in the Huffman table (S460). As a result of comparison, since the value '0' is identical to CodeWord '0', QuantValue '2' of the current code is returned (S480).

Now, bits remaining in the memory are '0110111'. Since all bits are not yet extracted from the memory, previous bit strings are initialized (S490) and another bit is extracted from the memory (S410). Thereafter, while bits are added to the bit string one by one, such as '0', '01', '011', '0110' '01101' and 011011,' the bit is compared with the next code of the Huffman table. However, since values of the bit string are not identical to CodeWords (NO in step S460), the steps from S410 to S460 are repeatedly performed. Even when the bit string became '0110111', if CodeWords of a code with CodeLength of 7 are 57 and 56, since values of the bit string are not identical to the CodeWords (NO in step S460), steps S470, S440 and S450 are performed in order. Only after these steps are performed, a value '55' of the bit string of '0110111' becomes identical to CodeWord '55' (YES in step S460) and then QuantValue '9' of the current code is returned (S480). Then, since all bits stored in the memory has been extracted (YES in step 490), all processes are ended.

An example where the system for decoding the conventional Huffman encoded data is constructed by pseudo codes is as shown in the following program 1.

```
--------------------------[Start of program 1]--------------------------
do(
    /*STEP1: obtain a value of Word and WordLength */
    ...
    a = extract(1bit);     //extract bit from memory one by one
    Word = Word << 1;      // add the extracted bits to a previous value
    Word + = a;
    WordLength++;          //the total number of bits read from memory
    ...
/*STEP2: read CodeWord and CodeLength from Huffman table and com-
pare them with the value obtained above */
        while (CodeLength (obtained from Huffman table) ==
WordLength (the number of bits of bit string read from input buffer)
        {
        if (Word == CodeWord[nIndex])//find identical CodeWord from table
            {
                QuantizationValue = pHuffmanQ—>QuantValue[nIndex];
                Return 1;
                    //return corresponding QuantValue if all values of
                        CodeLength and CodeWord are identical
            }
            else
                Index++;
                    //increase Index if only one of two values is not identi-
            cal CodeLength=pHuffmanQ->WordLength[nIndex];
                    //repeat until next value is read and found
            }
    } while (HuffmanQ_Lookup(nQValue) == NULL);
--------------------------[End of program 1]--------------------------
```

The conventional Huffman algorithm is inherently a method for reducing the amount of data by quantizing and tabling a signal in an encoding process, and finding an actual value with reference to the same table when the signal is decoded in a decoder. Accordingly, as the number of times that the table is referred to or the value is found is increased, system resources are additionally consumed. In other words, this algorithm is inefficient in that unnecessary comparison (S440) is frequent until the value of a bit string composed of extracted bits and the number of bits become identical to the CodeWord and CodeLength of the Huffman table since the length of a next code is not known in the Huffman decoding process, and an ExtractBit function (a function for extracting bits from the memory) which consumes significant system resources is frequently called. Particularly, if the same CodeLength is frequently repeated in the Huffman table, inefficiency of the system continues to increase.

SUMMARY OF THE INVENTION

The present invention is conceived to solve the aforementioned problem. An aspect of the present invention is to efficiently reconstruct a conventional Huffman table.

Another aspect of the present invention is to reduce the consumption of system resources and perform decoding more rapidly by reducing search and comparison routine when Huffman decoding is performed.

According to one exemplary embodiment of the present invention for achieving the object, there is provided a method for decoding a Huffman code, comprising a first step of creating an improved Huffman table including an increment of a Huffman code length and the number of times the Huffman code length repeats; a second step of generating a new bit string by extracting bits by the increment of the Huffman code length from a memory in which Huffman encoded data are stored and adding the extracted bits to the end of a previous bit string; a third step of reading values of corresponding codes by the number of times Huffman code length repeats from the improved Huffman table and determining whether values identical to a value of the new bit string are present; and as a result of the determination, if a value of a code identical to the value of the new bit string is present, a fourth step of outputting a quantization value for identifying the code.

The method may further comprise, as a result of the determination in the first step, if a value of a code identical to the value of the new bit string is not present, a fifth step of again performing the steps from the second step to the fourth step.

The improved Huffman table may include an additional information table where the Huffman codes are arranged sequentially from a Huffman code having a lesser bit number, and the increment to a previous bit number for each bit number and the number of times of repeating for each bit number are configured as a set; and a table where values of codes and quantization values for each Huffman code are arranged.

According to another exemplary embodiment of the present invention, there is provided an apparatus for decoding a Huffman code, comprising a table generation unit for creating an improved Huffman table including an increment of a Huffman code length and the number of times the Huffman code length repeats; a bit extracting unit for generating a new bit string by extracting bits by the increment of the Huffman code length from a memory in which the Huffman encoded data are stored and adding the extracted bits to the end of a previous bit string; and a determination unit for reading values of corresponding codes by the number of times the Huffman code length repeats from the improved Huffman table, determining whether values identical to a value of the new bit string are present, and, if a value of a code identical to the value- of the new bit string is present, outputting a quantization value for identifying the code.

The apparatus may further comprise a data output unit for receiving the output quantization value and outputting the value of decoded data corresponding to the output quantization value.

The improved Huffman table may be generated in a Huffman encoder and transferred to a Huffman decoder, and the table generation unit may create the transferred table as it is. Further, the improved Huffman table may be created by reconfiguring an existing Huffman table transferred from the Huffman encoder to the Huffman decoder in the table generation unit.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Hereinafter, exemplary embodiments of the present invention will be described in detail with reference to the accompanying drawings. Advantages and features of the present invention and a method of achieving the advantages and the features will be apparent by referring to embodiments described below in detail in connection with the accompanying drawings. However, the present invention is not limited to the embodiments disclosed below and may be implemented in various different forms. The exemplary embodiments are provided only for completing the disclosure of the present invention and for fully representing the scope of the present invention to those skilled in the art and the present invention is defined only by the appended claims. Like reference numerals designate like elements throughout the detailed description.

Figure 5:
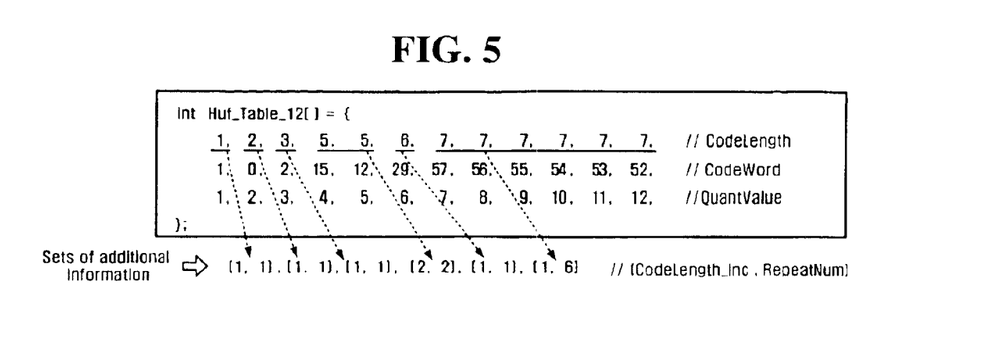
FIG. 5 is a view illustrating an 'additional information' generation process for improving the conventional Huffman table.

FIG. 5 is a view illustrating an 'additional information' generation process for improving the conventional Huffman table. In this process, CodeLength recorded for each code is changed to an increment of length of Huffman code (hereinafter, referred to as 'CodeLength_Inc') and the number of times the CodeLength repeats(hereinafter, referred to as 'RepeatNum'). For example, in the case of CodeLength of 5, since an increment of bit is 2 as compared with the previous CodeLength of 3 and the CodeLength of 5 is repeated twice, a set of additional information becomes (2, 2). In addition, in the case of CodeLength of 7, since the bit increment is 1 as compared with the previous CodeLength of 6 and the CodeLength of 7 is repeated six times, a set of additional information becomes (1, 6).

Figure 6:
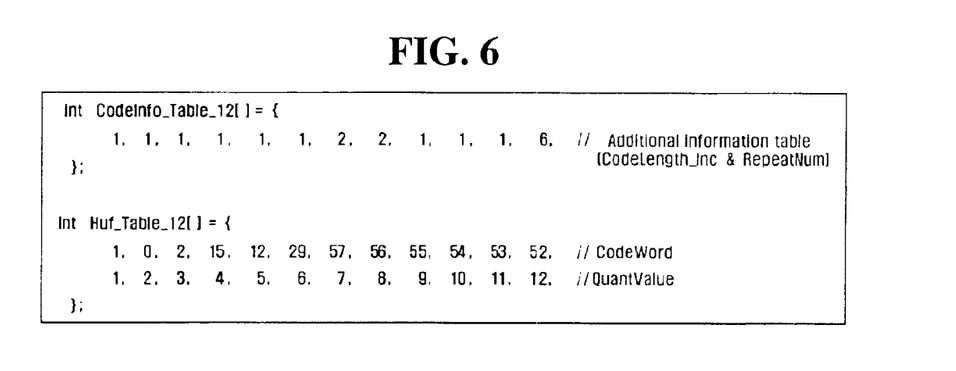
FIG. 6 is a view illustrating an example of an improved Huffman table according to the present invention.

FIG. 6 shows an improved Huffman table using the conventional Huffman table and additional information. An improved Huffman table according to the present invention includes the additional information table generated instead of the information related to the CodeLength of the conventional Huffman table. In addition, the improved Huffman table includes CodeWord and QuantValue except for the CodeLength of the conventional Huffman table. The CodeWord and QuantValue have the same values as the conventional Huffman table.

Figure 7:
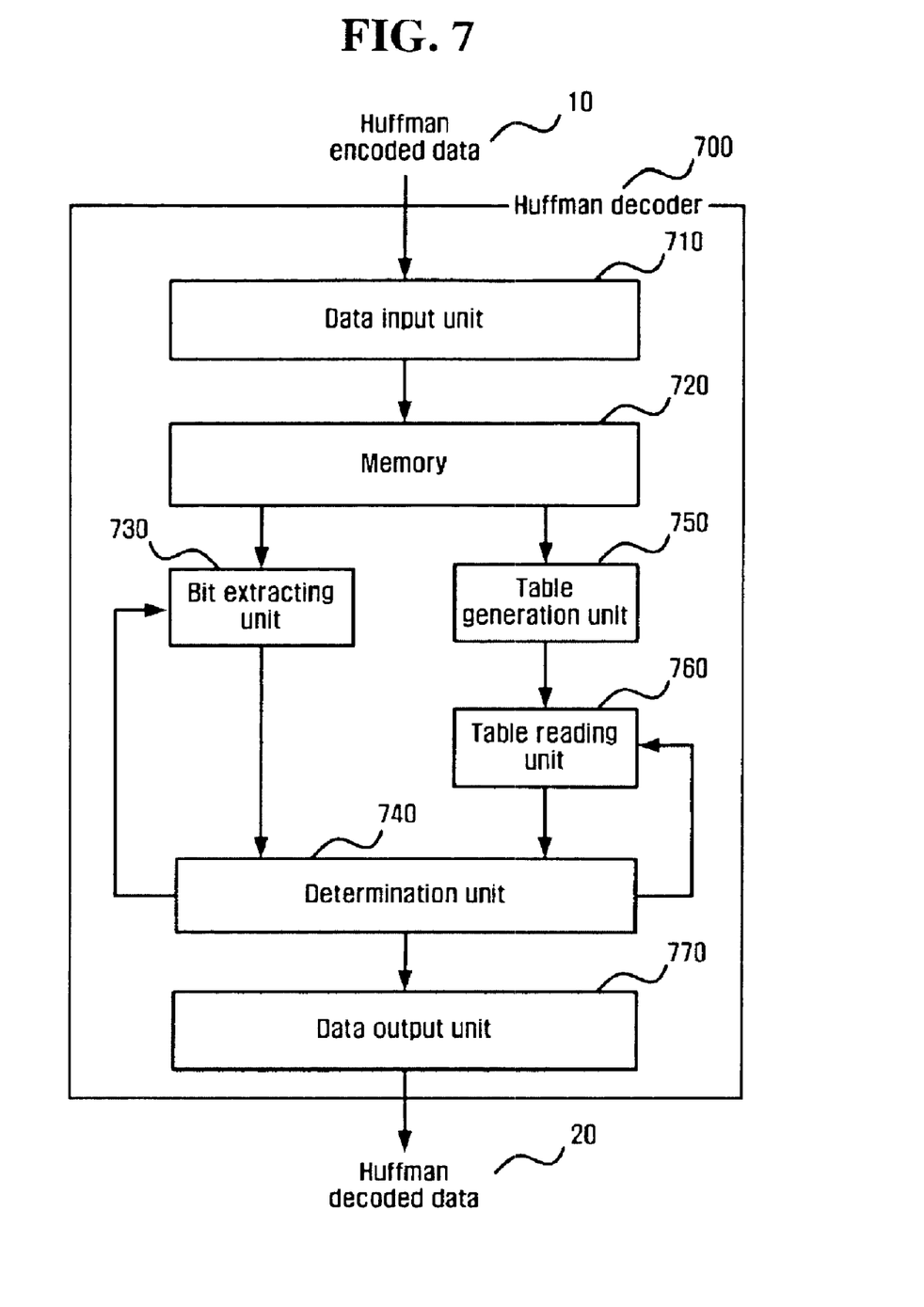
FIG. 7 is a block diagram illustrating a configuration of a Huffman decoder according to the present invention.

FIG. 7 is a block diagram illustrating a configuration of a Huffman decoder according to the present invention. A Huffman decoder 700 according to the present invention may be composed of a data input unit 710, a memory 720, a bit extracting unit 730, a determination unit 740, a table generation unit 750, a table reading unit 760, and a data output unit 770.

The data input unit 710 receives data 10 encoded in a Huffman code by means of a Huffman encoder.

The memory 720 stores the received data 10 and the conventional Huffman table therein. The conventional Huffman table may be stored in advance in the Huffman encoder and the Huffman decoder, or may be transferred from the Huffman encoder to the Huffman decoder using header information on transferring the data and then stored in the memory 720. In addition, the memory 720 stores not only the conventional Huffman table but also the improved Huffman table generated by reconfiguring the conventional Huffman table. As such, it should be noted that the present invention can be implemented not only by generating the improved Huffman table using the conventional Huffman table in the Huffman decoder, but also by first generating the improved Huffman table in the Huffman encoder, transferring it to the Huffman decoder along with encoded data, and then directly using the transferred table in the Huffman decoder. Configurations of the conventional Huffman table and the improved Huffman table are as described in FIG. 2 and FIG. 6, respectively.

The bit extracting unit 730 extracts bits by the CodeLength_Inc value of the additional information of the improved Huffman table from data stored in the memory 720, and, if there exists a bit string already extracted, it generates a new bit string by adding the extracted bit to the end of the extracted bit string.

The table generation unit 750 generates the improved Huffman table suggested in the present invention by generating the 'additional information' from the CodeLength information of the conventional Huffman table and reconfiguring the conventional Huffman table.

The table reading unit 760 reads the CodeWord and QuantValue by the predetermined number of times from the improved Huffman table.

The determination unit 740 compares the bit string currently generated by the bit extracting unit 730 with the CodeWord read by the number of RepeatNums from the table reading unit 730, and determines whether there exists the same value, and, if so, QuantValue of the code is returned.

Finally, the data output unit 770 receives the returned QuantValue and outputs a value of decoded data 20 corresponding to the received QuantValue.

Figure 8:
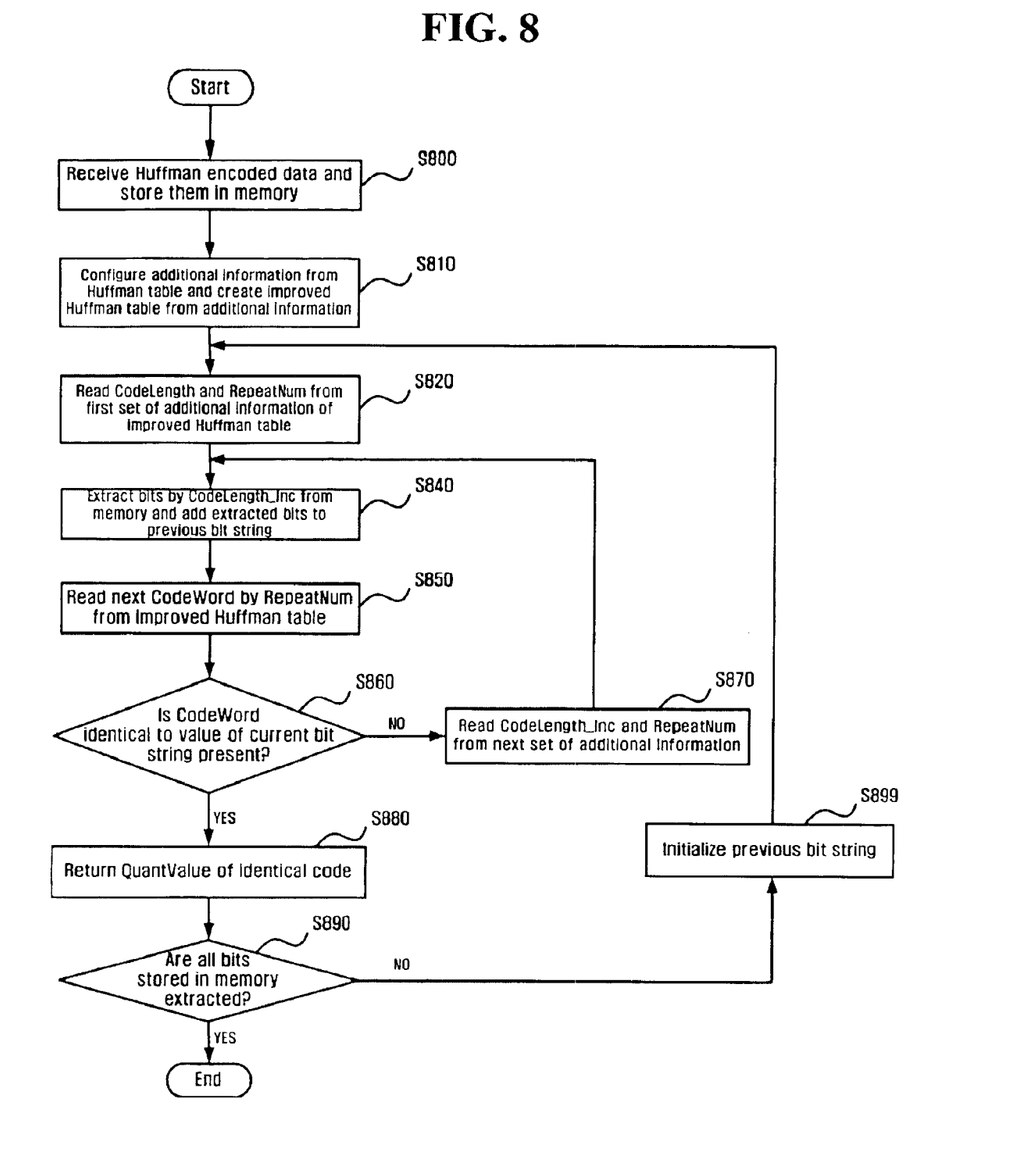
FIG. 8 is a flowchart showing an operation procedure of the present invention.

FIG. 8 is a flowchart showing an operation procedure of the present invention.

First, the data input unit 710 receives the Huffman encoded data 10 and stores the received data 10 in the memory 720 (S800). Next, the table generation unit 750 configures the additional information from the conventional Huffman table and creates the improved Huffman table from the additional information (S810). If the improved Huffman table is configured in the Huffman encoder and then is transferred to the Huffman decoder along with the data, or if it is beforehand promised that a particular improved Huffman table is used between the Huffman encoder and the Huffman decoder, since it means that the improved Huffman table has been already generated, step S810 may be omitted. Next, the table reading unit 760 reads the CodeLength_Inc and the RepeatNum from a first set of information of the improved Huffman table stored in the memory 720 (S820).

Figure 9:
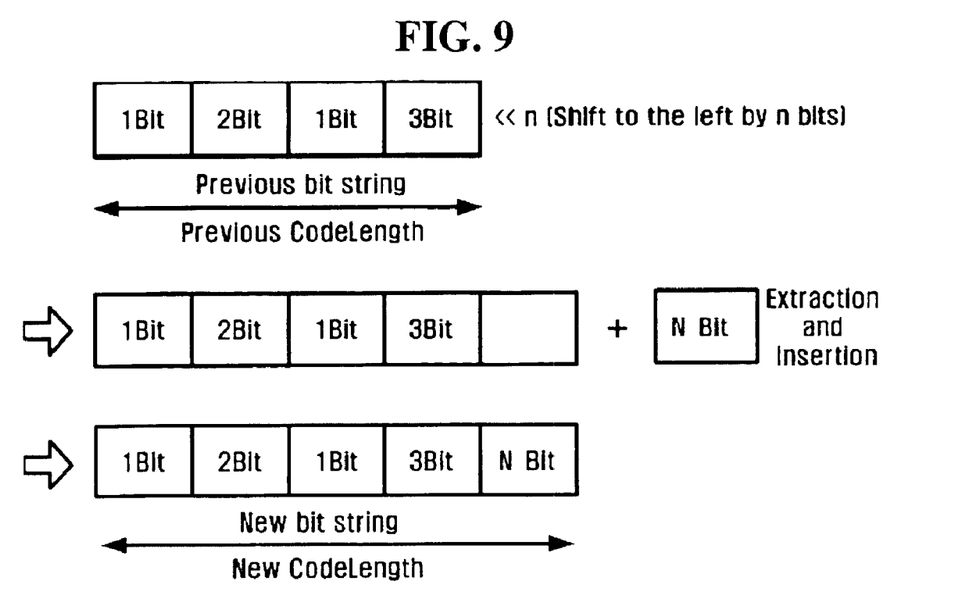
FIG. 9 is a view for explaining a step S840 in more detail.

The bit extracting unit 730 generates a new bit string by extracting a bit by the CodeLengt_Inc from the data stored in the memory 720 and adding the extracted bit to the previous bit string (S840). Referring to FIG. 9 where step S840 is more particularly shown, when it is assumed that the CodeLength of the bit string extracted and generated previously is 7 bits, in order to extract a new N bit and insert the new N bit at the end of the bit string, a space into which the N bit is inserted should be first secured by shifting the previous bit string to the left side by the N bit in the memory. Thereafter, when the extracted N bits are inserted into the end of the previous bit string, the new bit string with a CodeLength of 7+N bits is generated.

Next, the table reading 760 reads next CodeWords by the number of ReadNums from the improved Huffman table stored in the memory 720 (S850). Then, the determination unit 740 determinates whether a CodeWord identical to a value of the current bit string of the read CodeWords is present (S860). If present (YES in step S860), the QuantValue of the identical code is returned (S880). In addition, if the determination unit 740 extracted all bits of the data stored in the memory (YES in step S890), the process is ended. Otherwise (NO in step S890), the previous bit strings extracted from the data stored in the memory are initialized to a value of 'NULL' (S899) and then the steps after step S820 are repeatedly performed.

As a result of the determination in step S860, if an identical CodeWord is not present (NO in step S860), the table reading unit 760 reads the CodeLength_Inc and RepeatNum from the next set of additional information of the improved Huffman table (S870) and then the steps after step S830 are repeatedly performed.

In order to more fully understand the process of FIG. 8, an example where actual values are applied to the data will be described. For example, it is assumed that data received from the Huffman encoder and stored in the Huffman decoder is '000110111' and the improved Huffman table is as shown in FIG. 6. First, a first set (1,1) of additional information of the improved Huffman table is read, it is confirmed that CodeLength_Inc=1 and RepeatNum=1, one bit '0' is extracted from data stored in the memory, and then the extracted bit '0' is compared with a CodeWord by the RepeatNum, i.e., one CodeWord '1'. Since both values are different from each other, a second set (1,1) is again read, it is confirmed that Codelength_Inc=1 and RepeatNum=1, one bit '0' is extracted from next data stored in the memory in order to generate a new bit string ('00'), and then this new bit string is compared with one next CodeWord '0'. Since both are equal to each other, QuantValue '2' corresponding to the CodeWord is returned.

Now, the data remaining in the memory is '0110111'. Since all bits are not yet extracted from the memory, previous bit strings are initialized (S490). A bit string extracted when the above processes are repeatedly performed from the first set (1,1) to a third set (1,1) of additional information of the improved Huffman table becomes '011'. Next, a fourth set (2, 2) is read, it is confirmed that CodeLength_Inc=2 and RepeatNum=2, two bits ('01') are extracted from the next data stored in the memory in order to generate a new bit string ('01101'), and then this new bit string is compared with the two next CodeWords '15' and '12'. This new bit string '01101' is expressed as 13 in decimal number, which is different from any one of the two CodeWords. Then, a fifth set (1,1) is again read and then a bit string '011011' is compared with 29. The bit string '011011' is 27 in decimal number, which is not identical to 29. Then, a sixth set (1,6) is read. Then, the new bit string becomes '0110111' (55 in decimal number). Since the next six codes are respectively read as 57, 56, 55, 54, 53, 52 according to RepeatNum '6'. QuantValue '9' corresponding to an identical number 55 is returned. Now, since no data remain in the memory, all processes are ended.

An example where the system for decoding the Huffman encoded data according to the present invention is constructed by pseudo codes is as shown in the following program 2.

---

--------------------------[Start of program 2]----------------------------------
```
do(
    /*Step1: predetermine the number of loops with the number of times
        the same WordLength is repeated */
    . . .
    nbit = pHuffmanQ—>CodeInfo[mIndex++]
```

```
                -continued repeatNum = pHuffmanQ—>CodeInfo[mIndex++]
    a = extract(1bit);
        //extract n bits from memory at a time as required
    Word = Word << n;      // add the extracted bits to a previous value
    Word + = a;
    WordLength+ = n;       //the total number of bits read from input
                           buffer
    . . .
/*STEP2: changed to a system for finding the same CodeWord value from
Huffman table within the predetermined number of times */
        for(I = 0; I < repeatNum; I = I + 1)
            //a portion to be read from memory and compared each time
is removed
        {
    if (Word == pHuffmanQ->CodeInfo[nIndex]
                           //same codeword value is found in table
    {
            QuantizationValue =
            pHuffmanQ—>Quantvalue[nIndex++];
            Return 1;
                //since the number of times the same CodeLength is
                  repeated is known beforehand, only
                  CodeWords are compared, and if equal, the
                  corresponding QuantValue is returned
        }
            }
    ) while (HuffmanQ_Lookup(nQValue) == NULL);
--------------------------[End of program 2]----------------------------------
```

In devices loaded with embedded systems, when the amount of system resources to be used increases, consumption power is accordingly increased and higher performance chipsets are required to operate the devices, which results in causing increased costs of manufacture or use of the devices. Accordingly, improvement in software algorithms allowing the devices to use fewer system resources, in particular, is in need.

According to the present invention, in devices using Huffman decoding algorithms, unnecessary consumption of system resources can be reduced by reconfiguring a Huffman table efficiently and decreasing the number of times search and comparison routines are used. Particularly, when there is a plurality of Huffman codes having the same length in the Huffman table, a memory for storing the Huffman table can be significantly saved.

Although there may be some differences depending on the application environment, a result of testing with a program implemented by an assembler shows an improvement effect of about 30 to 40% in performance.

Although the present invention has been described in connection with the preferred embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A method for decoding a Huffman code, comprising:
   (a) creating an improved Huffman table including an increment of a Huffman code length and a number of times the Huffman code length repeats;
   (b) generating a new bit string by extracting bits by the increment of the Huffman code length from a memory in which Huffman encoded data are stored and adding the extracted bits to an end of a previous bit string;
   (c) reading values of corresponding Huffman codes by the number of times the Huffman code length repeats from the improved Huffman table and determining whether a value identical to a value of the new bit string is present; and
   (d) outputting a quantization value for identifying the Huffman code if a value of the Huffman code identical to the value of the new bit string is present, as a result of the determination in step (c).

2. The method as claimed in claim 1, further comprising performing again the steps (b) to (d) if the value of the Huffman code identical to the value of the new bit string is not present, as the result of the determination in step (c).

3. The method as claimed in claim 1, wherein the improved Huffman table includes:
   an additional information table where the Huffman codes are arranged sequentially from a Huffman code having a lesser bit number, and an increment to a previous bit number for each bit number and a number of times each bit number repeats are configured as a set; and
   a table where values of the Huffman codes and quantization values for each Huffman code are arranged.

4. An apparatus for decoding a Huffman code, comprising:
   a table generation unit for providing an improved Huffman table including an increment of a Huffman code length and a number of times the Huffman code length repeats;
   a bit extracting unit for generating a new bit string by extracting bits by the increment of the Huffman code length from a memory in which Huffman encoded data are stored and adding the extracted bits to an end of a previous bit string; and
   a determination unit for reading values of corresponding Huffman codes by the number of times the Huffman code length repeats from the improved Huffman table, determining whether a value identical to a value of the new bit string is present, and, if a value of the Huffman code identical to the value of the new bit string is present, outputting a quantization value for identifying the Huffman code.

5. The apparatus as claimed in claim 4, further comprising a data output unit for receiving the output quantization value and outputting a value of decoded data corresponding to the output quantization value.

6. The apparatus as claimed in claim 4, wherein the improved Huffman table includes:
   an additional information table where the Huffman codes are arranged sequentially from a Huffman code having a lesser bit number, and the increment to a previous bit number for each bit number and the number of times each bit number repeats are configured as a set; and
   a table where values of the Huffman codes and quantization values for each Huffman code are arranged.

7. The apparatus as claimed in claim 4, wherein the improved Huffman table is generated in a Huffman encoder and transferred to a Huffman decoder, and the table generation unit provides the improved Huffman table as received.

8. The apparatus as claimed in claim 4, wherein the improved Huffman table is created by reconfiguring an existing Huffman table transferred from the Huffman encoder to the Huffman decoder in the table generation unit.

9. A computer readable medium including program codes executable by a computer to perform a method for decoding a Huffman code, comprising:
   creating an improved Huffman table including an increment of a Huffman code length and a number of times the Huffman code length repeats; generating a new bit string by extracting bits by the increment of the Huffman code length from a memory in which Huffman encoded data are store and adding the extracted bits to an end of a previous bit string;

reading values of corresponding Huffman codes by the number of times the Huffman code length repeats from the improved Huffman table and determining whether a value identical to a value of the new bit string is present; and outputting a quantization value for identifying the Huffman code if a value of the Huffman code identical to the value of the new bit string is present.

* * * * *